United States Patent
Davidescu

(10) Patent No.: US 6,426,674 B1
(45) Date of Patent: Jul. 30, 2002

(54) CIRCUIT AND METHOD FOR COMPENSATING AN OFFSET VOLTAGE IN AN OPERATIONAL AMPLIFIER

(75) Inventor: Dragos Davidescu, Aix en Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/558,981

(22) Filed: Apr. 27, 2000

(30) Foreign Application Priority Data

Apr. 28, 1999 (FR) .............................. 99 05396

(51) Int. Cl.[7] .............................. H03F 1/02; H03F 3/45
(52) U.S. Cl. .......................................... 330/9; 330/253
(58) Field of Search .............................. 330/9, 2, 255, 330/253; 327/124, 307

(56) References Cited

U.S. PATENT DOCUMENTS

| | | | |
|---|---|---|---|
| 4,371,843 A | 2/1983 | Fang et al. | 330/253 |
| 4,616,189 A | 10/1986 | Pengue, Jr. | 330/253 |
| 5,142,238 A * | 8/1992 | White | 330/9 |
| 5,182,525 A | 1/1993 | Theus | 330/253 |
| 5,349,304 A * | 9/1994 | Ryat | 330/253 |
| 5,397,994 A | 3/1995 | DuPuis | 327/307 |
| 5,422,529 A | 6/1995 | Lee | 327/536 |
| 5,451,901 A | 9/1995 | Welland | 330/133 |
| 5,475,339 A | 12/1995 | Maida | 327/561 |
| 5,550,512 A | 8/1996 | Fukahori | 330/254 |
| 5,777,514 A | 7/1998 | Mittal et al. | 330/253 |
| 5,789,974 A * | 8/1998 | Ferguson et al. | 330/9 X |
| 5,831,327 A | 11/1998 | Kimura | 322/563 |

FOREIGN PATENT DOCUMENTS

| | | |
|---|---|---|
| EP | 0516423 A1 | 12/1992 |
| EP | 0607971 A2 | 7/1994 |

OTHER PUBLICATIONS

French Search Report dated Apr. 7, 2000 with annex to French Application No. 9905396.

* cited by examiner

Primary Examiner—Steven J. Mottola
(74) Attorney, Agent, or Firm—Lisa K. Jorgenson; Stephen Bongini; Fleit, Kain, Gibbons, Gutman & Bongini P.L.

(57) ABSTRACT

An operational amplifier is provided that includes an inverting input channel, a non-inverting input channel, and an output stage. Each of the input channels controls at least one input transistor, and the output stage supplies an output voltage as a function of a potential difference at the input channels. Additionally, the operational amplifier includes at least one signal correction element in association with at least one of the input channels. The signal correction element is selectively put into circuit to selectively add an offset voltage correction signal to a signal that is supplied to the output stage in order to balance the characteristics of the two input channels. Also provided is a circuit for correcting the offset voltage of an operational amplifier. The circuit includes means for determining the output voltage of the operational amplifier, means for applying a reference voltage to one of the inputs of the operational amplifier, means for selectively coupling the inputs of the operational amplifier, and programming means for programming the placing of at least one signal correction element into circuit. Additionally, a method is provided for correcting the offset voltage of an operational amplifier in which an offset correction signal is determined by an iteration of cycles.

20 Claims, 5 Drawing Sheets

CIRCUIT AND METHOD FOR COMPENSATING AN OFFSET VOLTAGE IN AN OPERATIONAL AMPLIFIER

CROSS-REFERENCE TO RELATED APPLICATIONS

This application is based upon and claims priority from prior French Patent Application No. 99-05396, filed Apr. 28, 1999, the entire disclosure of which is herein incorporated by reference.

BACKGROUND OF THE INVENTION

1. Field of the Invention

The present invention relates to operational amplifiers, and more specifically to a circuit and method for compensating the offset voltage at the output of an operational amplifier.

2. Description of Related Art

A conventional operational amplifier is an analog (i.e., linear) circuit which can amplify voltages with a very high gain (e.g., 10,000 or more). It produces at its output a voltage which is proportional to the potential difference presented at its two inputs, which are known as the inverting and non-inverting inputs. The amplified voltage output is delivered at low impedance, so it is possible to drive relatively high loads without incurring significant stability losses. Conversely, the inputs exhibit a very high impedance, so as to allow weak signals to be amplified. Because of these advantageous characteristics, operational amplifiers are very widely used as basic elements in electronic circuits, such as drive, filtering, sampling, signal conversion (e.g., between analog and digital), and measurement circuits. They are also used as a virtual ground (i.e., to form a node in a circuit that exhibits a zero or fixed voltage without current consumption).

Operational amplifiers are generally constructed in the form of integrated circuits. In a typical application, several separate operational amplifiers can be integrated on a common substrate with numerous other circuit elements, which can be both analog and digital. For instance, a very large scale integration (VLSI) integrated circuit can include several tens of operational amplifiers, digital-to-analog converters, memories, a microprocessor, and the like to form a specific functional unit such as a control loop. An operational amplifier can be constructed with either bipolar transistors or field effect transistors, such as MOS transistors. There now exist operational amplifiers made using CMOS technology which can operate at very low voltages (e.g., on the order of 2V). Amplifiers made using CMOS technology can be integrated on a common substrate with digital CMOS circuits.

FIG. 1 shows a simplified circuit diagram of a conventional CMOS operational amplifier. This operational amplifier is based on a two-stage architecture having a differential input stage and a gain stage. In this amplifier, the gain stage also constitutes the operational amplifier's output stage. The active elements of the differential input stage are formed by two NMOS transistors Q1 and Q2, which constitute a differential pair. The control gates of transistors Q1 and Q2 are connected to the inverting input EI and the non-inverting input ENI, respectively.

The differential input stage is connected to a load in the form of a current source that is formed by two PMOS transistors Q3 and Q4, which are connected to form a current mirror. The gain stage includes a PMOS transistor Q5 and its active load formed by transistors Q7, Q8, and Q9. The operation of the current sources is established by an input or a fixed reference current EIref. Conventionally, a compensation for the characteristics between the open loop and closed loop modes is obtained by a pole sharing capacitor C. Since the amplifier is given a unitary gain, this capacitor C is coupled between the output S and the gain stage input.

In principle, because an operational amplifier amplifies a difference in voltage between its two inputs EI and ENI, the voltage VO at the output S should be zero when these inputs are at the same potential (for example, by being connected together). However, in practice, an operational amplifier exhibits a spurious output voltage known as the offset voltage when there is no potential difference between the two inputs EI and ENI. This offset voltage is due to an imbalance between the characteristics of the amplifier's respective inputs EI and ENI. Thus, the offset voltage is a component of the output signal which distorts the operation of the operational amplifier relative to its theoretical characteristics.

In the CMOS technology circuits currently being used for digital applications by virtue of their low current consumption, it is often necessary to bring together on the same substrate analog circuits such as differential amplifiers with purely digital circuit elements. At present, the use of operational amplifiers in logic circuits, especially in CMOS technology, is limited by non-uniformities in the transistor characteristics, which are linked to fabrication processes. Although tolerable with logic circuits which operate in a binary mode, these non-uniformities give rise to relatively large offset voltages (e.g., on the order of 5 to 10 mV in the case of operational amplifiers).

Techniques exist for calibrating an operational amplifier so as to reduce the offset voltage. Such zero-setting techniques consist in biasing one of the inputs EI or ENI of the amplifier (or more often an intermediate stage downstream of these inputs) with a fixed compensation voltage. This compensation voltage is set so as to re-balance the amplifier's inputs EI and ENI so that the output voltage V0 is substantially equal to zero when the inputs EI and ENI are at the same potential. A first conventional operational amplifier zero-setting technique consists in periodically alternating the amplifier's operating mode between a measurement phase and a normal operating mode phase. During the measurement phase, the two inputs EI and ENI of the operational amplifier are connected together so as to bring them to the same potential, and the amplifier's offset voltage S is detected (e.g., by a sample-and-hold circuit). This offset voltage is used to produce a compensation voltage applied to a compensation input of the amplifier.

FIG. 2 shows an exemplary circuit for resetting to zero the offset voltage by using a sample-and-hold circuit. A switch 2 is connected to one of the inputs (ENI) of the operational amplifier 1 to connect that input selectively either to an external input voltage Vin in the normal operating mode (position P1), or to the amplifier's other input (EI) during the measurement phase (position P2). A reference voltage source VS1 just before the EI input of the amplifier 1 serves to set the two inputs ENI and EI to the same potential during the measurement phase. During the measurement phase, the switch 2 is positioned at position P2 to disconnect the ENI input from its external input signal Vin and to set the amplifier's two inputs EI and ENI to the voltage Vref of voltage source VS1. The voltage at the amplifier's output S then corresponds to the offset voltage. This voltage is zeroed by applying a compensation voltage at an intermediate input N of the amplifier 1.

For this purpose, a feedback circuit is provided between the output S and the intermediate input N of the amplifier 1. In this exemplary amplifier, the feedback circuit includes a sample-and-hold circuit 4 whose input receives the output signal of the amplifier 1 via a buffer amplifier 6 and whose output is connected to the intermediate input N. The feedback circuit 4 and 6 serves to provide the right correction voltage at the intermediate input N by successive samplings. When this correction voltage is obtained, the switch 2 is set to position P1 to allow the amplifier to operate in the normal mode. However, the operational amplifier cannot fulfil its normal function of amplifying the signal Vin during this measurement phase.

The sample-and-hold technique can be replaced by a digital approach as shown in the exemplary amplifier of FIG. 3. The connections and operation at the inputs ENI and EI of the amplifier 1 are identical to those of the amplifier of FIG. 2. However, the sample-and-hold circuit 4, which is essentially analog in nature, is replaced by a digital register 8 and a digital-to-analog converter 1 0. During the measurement phase (with the switch 2 at position P2), the digital register 8 successively records at each cycle of a clock Clk a digital value corresponding to the offset value at the output S of the amplifier 1.

These values are converted into analog voltages by the converter 10 and then inputted at the intermediate input N of the amplifier. Thus, there is obtained a new value at the intermediate input N at each clock cycle, and this converges to the required correction value. For a more detailed description of such conventional operational amplifier output correction techniques, reference is made to C. Enz and G. Temes, "Circuit techniques for reducing the effects of op-amp imperfections: autozeroing, correlated double sampling, and chopper stabilization", which is published in Proceedings of the IEEE, vol.84, No. 11, November 1996, pages 1584 to 1614, which is herein incorporated by reference.

Offset voltage correction techniques based on sample-and-hold such as those described with reference to FIG. 2 have the drawback of requiring periodic reiterations of the measurement phase (with the switch 2 at position P2) in order to renew the correction voltage. In particular, the correction voltage is stored in a capacitor which loses its charge over time. As a result, the sampling technique can only be used in applications such as in comparators for analog-to-digital converters which can handle a periodic interruption of the operational amplifier's normal operating mode to perform a measurement phase.

It is possible to overcome this problem of interruption by providing two operational amplifiers that are corrected in their offset values and operate in a shared mode on a common amplification channel. In such a case, an output switch alternately sends the output signal of each amplifier on the output channel during a limited period of normal operation. This solution has the drawback of introducing switching noise on the output channel. Moreover, the corresponding circuit increases the output impedance and requires twice the chip area of a single amplifier channel.

Furthermore, the offset correction by an external digital circuit such as that described with reference to FIG. 3 is relatively complex to implement both with regard to the associated digital elements and the algorithms used.

SUMMARY OF THE INVENTION

In view of these drawbacks, it is an object of the present invention to overcome the above-mentioned drawbacks and to provide an operational amplifier having at least one signal correction element that can be selectively put into circuit to add an offset voltage correction signal to the signal supplied to the output stage. The correction element or elements re-balance the characteristics of the two input channels so that the voltage offset is substantially zeroed. Thus, each element acts like a trimmer in association with the corresponding transistor.

Another object of the present invention is to provide an operational amplifier having means for determining the output voltage of the operational amplifier, means for applying a reference voltage to one of the inputs of the operational amplifier, means for selectively connecting the inputs of the operational amplifier, and programming means for programming the placing into circuit of at least one signal correction element of the operational amplifier.

Yet another object of the present invention provides a method of correcting the offset voltage of an operational amplifier in which an offset correction signal is determined by an iteration of cycles. According to the method, the offset voltage is measured, and then one or more signal correction elements are put into circuit to add the offset voltage correction signal in order to balance the characteristics of input channels of the operational amplifier.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
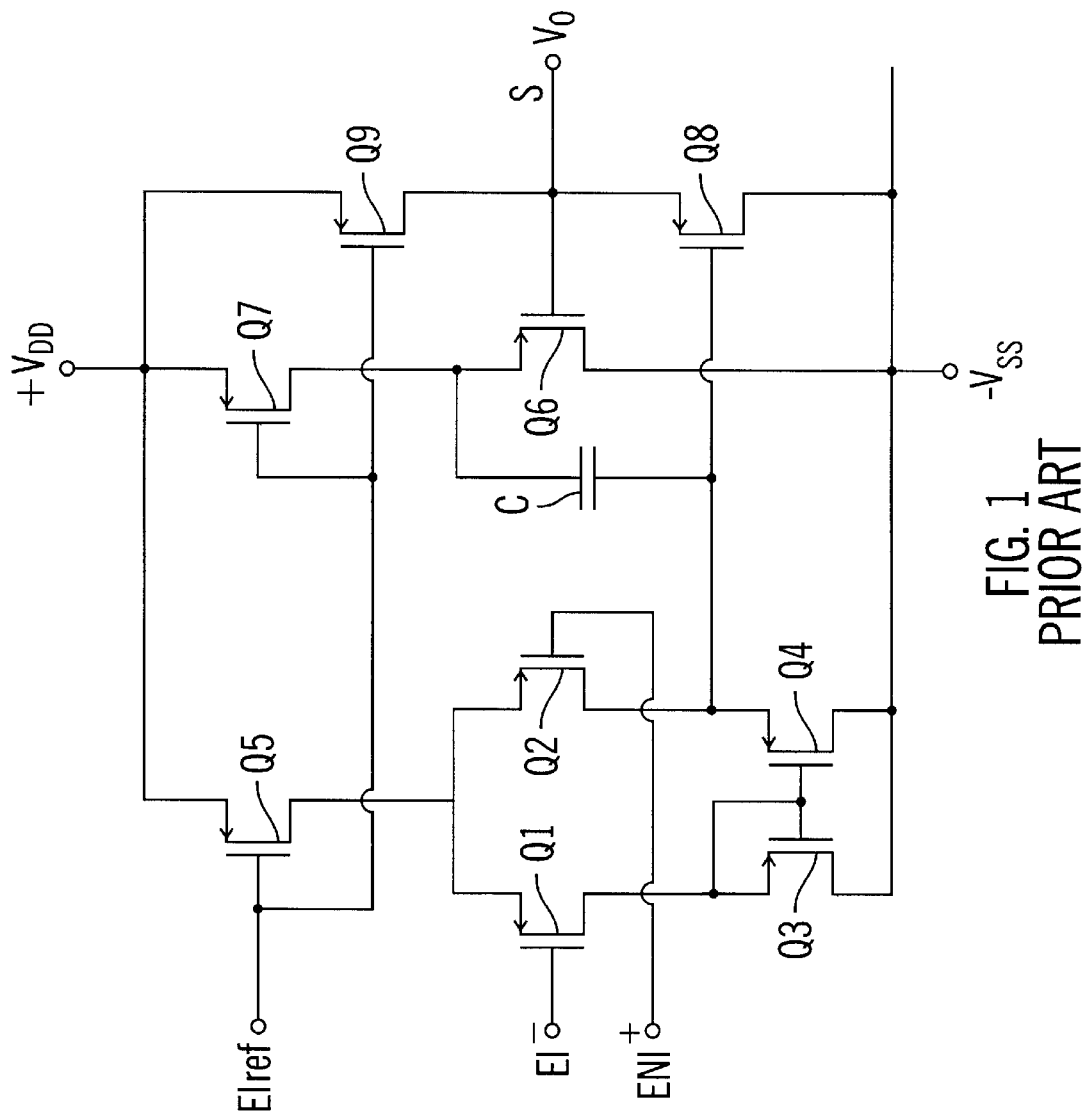
FIG. 1 is a schematic diagram of a conventional operational amplifier made using CMOS technology.
Figure 2:
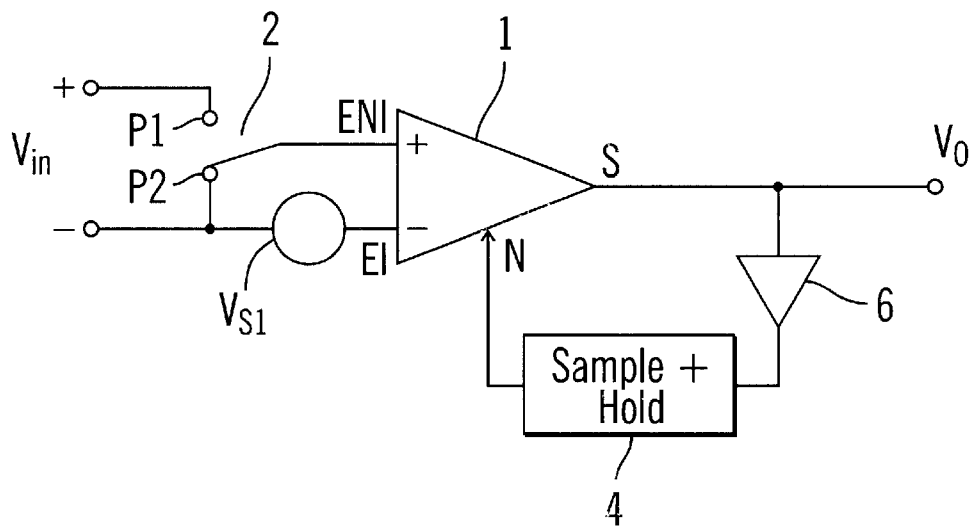
FIG. 2 is a circuit diagram of a conventional operational amplifier having an offset correction circuit based on a sample-and-hold technique.
Figure 3:
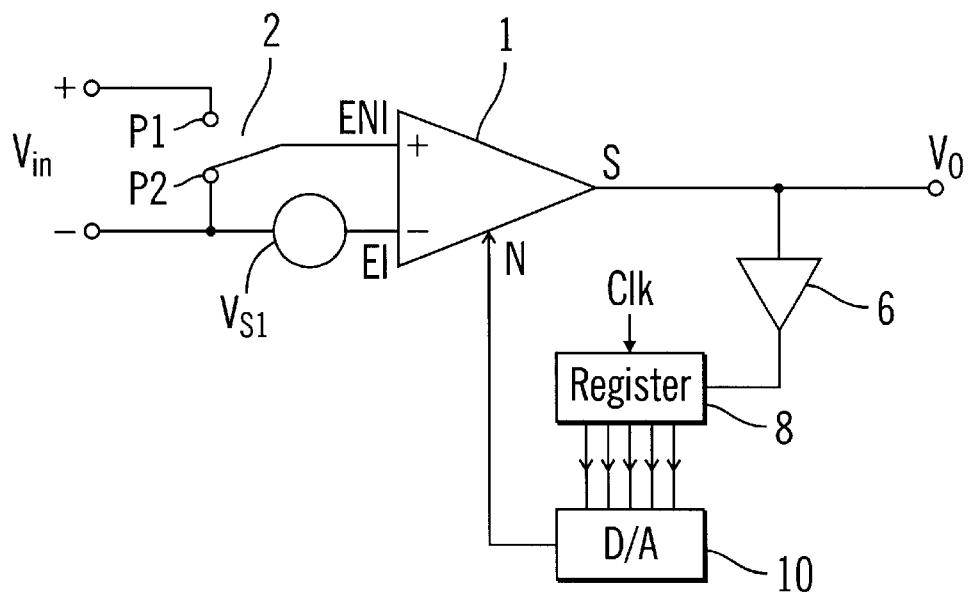
FIG. 3 is a circuit diagram of a conventional operational amplifier having an offset correction circuit based on an external analog-to-digital converter.

Preferred embodiments of the present invention will be described in detail hereinbelow with reference to the attached drawings.

Preferred embodiments of the present invention provide an operational amplifier having an inverting input channel and a non-inverting input channel that each control at least one input transistor, and an output for supplying a voltage as a function of a potential difference at the two inputs. The operational amplifier also includes at least one signal correction element associated with at least one of the input channels that can be selectively put into circuit to add an offset voltage correction signal to the signal supplied to the output stage. The correction element or elements re-balance the characteristics of the two input channels so that the voltage offset is substantially zeroed. Thus, each element acts like a trimmer in association with the corresponding transistor.

Advantageously, these correction elements act directly at the level of at least one of the input transistors. However, in other embodiments, the correction elements are provided at another level of the respective channels, which is downstream of the input transistors (for example, at the level of an intermediate stage). Preferably, the correction element is a correction transistor which can be selectively put into circuit in parallel with a transistor of the amplifier (for example, the input transistor with which it is associated) to supply a correction signal which evolves with the signal received at the input. This correction signal combines (additively or subtractively) with the signal coming from the corresponding transistor. A remarkable effect of this embodiment of the present invention is that the correction signal evolves dynamically in correlation with the input signal. Thus, the obtained correction ensures good linearity throughout the amplifier's operating range.

If the amplifier is made using bipolar transistors, the command input is preferably the base of the input transistor, with the collector and emitter being connected one and the other to the output stage and to a current source. Likewise, if the amplifier is made using MOS transistors (for example, in CMOS technology), the command input is preferably the gate, with the drain and source being connected one and the other to the output stage and to a current source.

For a given input channel, selectively putting into parallel at least one correction transistor with a transistor associated with that channel is equivalent to modifying the characteristics of the latter transistor. The response can then be modified to approach that of the corresponding transistor of the other input channel. In practice, there can exist significant differences in the response of the two input transistors (which form a differential pair) due to inevitable tolerances in the different fabrication stages. These differences are at the origin of the offset voltage.

Advantageously, there is provided at least one correction transistor for each of the two operational amplifier inputs. This arrangement allows compensation for both positive and negative offsets. Additionally, the response characteristic of each correction transistor are preferably chosen to be weak relative to the response characteristic of the corresponding corrected transistor. In other words, for a same input signal level, a correction transistor produces at the output stage a signal which is significantly weaker than that of the input transistor. For example, in some embodiments, the output signal value of a correction transistor is on the order of 0.5 to 10% of that of the input transistor for the same input signal.

Preferably, there is provided for one or each input of the operational amplifier a number n of correction transistors, where n is an integer greater than 1, with each transistor being independently connectable in parallel with the associated transistor. The signals produced at the output stage of each of the n transistors selected to be in circuit combine additively. In preferred embodiments, the same command input allows a correction element associated with one or the other of the two input channels of the operational amplifier to put into circuit depending on the state of a selection input connected with a switching means.

In a preferred embodiment, the n correction transistors associated to an input channel do not all have the same response characteristic. Such an arrangement makes it possible to obtain an optimal correction signal by a combination of several transistors. Advantageously, the n correction transistors associated with an input can exhibit a geometrical progression in their response values. For example, this progression can correspond to a binary progression scale. In this case, the progression in the response values of the n transistors begins with the lowest value W as follows: W, 2W, 4W, ..., $2^{n-1}$W. This progression law makes it possible to obtain, by combination, all of the response values between W and $2^n \times W - 1$ by increments of W.

Preferably, the placing of each correction transistor into circuit is accomplished by a switching means that is accessible through external command inputs. Thus, an individual command input is provided for each correction element. In a preferred embodiment of the present invention, the switching means is activated by binary signals. Consequently, it is possible to control all possible combinations of the n switching elements by presenting at each of the n control inputs a respective bit of an n-bit binary word (e.g., from a register). In such a case, the progression in the weight of bits can advantageously be attributed in correlation with the response values of the n switching elements.

The present invention can be implemented in CMOS operational amplifiers having a rail-to-rail input voltage range that enables an input signal amplitude ranging from the low power supply voltage Vss to the high power supply voltage Vdd of the CMOS transistors to be processed. Such amplifiers employ for each input two input transistors that each form an element of a differential transistor pair, with one of the pairs being in NMOS technology and the other being in PMOS technology. In this case, each of the NMOS and PMOS transistors of one and the other input can be associated with a correction element according to the above-described different arrangements. The offset voltage of each transistor of the pair is independent, which gives an overall offset voltage which is dependent on the common mode, and thus difficult to compensate using conventional techniques. With the present invention, the offset compensation which is obtained independently for each transistor of the pair becomes relatively simple.

Other embodiments of the present invention provide a circuit for correcting the offset voltage of an operational amplifier that includes means for determining the output voltage of the operational amplifier, means for applying a reference voltage to one of the inputs of the operational amplifier, means for selectively connecting the inputs of the operational amplifier, and programming means for programming the placing into circuit of at least one signal correction element of the operational amplifier. Preferably, the programming means includes a register that can store data for programming the placing into circuit of at least one signal correction element in the form of a binary word, with this binary word being continuously presented at an output channel of the register and being externally loadable during an offset voltage correction process of the operational amplifier.

The present invention lends itself to different techniques for determining the proper required correction value. In one preferred embodiment, the offset correction value is determined by an iteration of cycles including a step for measuring the offset voltage followed by a step for selecting one or multiple correction elements to be placed in the circuit. Each new cycle allows the offset correction value to come closer to the ideal correction value. When the selection of control elements is controlled by a binary word, the binary word preferably corresponds to a value stored in a register which is updated at each cycle. Accordingly, the final value obtained at the conclusion of the offset correction value determination is permanently stored in the register. As a result, this determination can be performed only once (for example, during circuit power up). Thus, the obtained correction is applied continuously to maintain an optimal operation of the amplifier at all times.

Advantageously, the step for measuring the offset voltage takes place in two stages. First, the output voltage of the amplifier is measured in a voltage follower configuration with a feedback to the inverting input via a resistance having a first value and a reference voltage applied to the non-inverting input. The output voltage then expresses the reference voltage minus the offset voltage. Second, the output voltage is measured with a feedback to the inverting input with the two inputs connected together. The output voltage then expresses the voltage reference minus a multiple of the offset voltage determined by the first value of the feedback resistance. With this value being known, there is then obtained the offset value directly in terms of a coefficient of the value of the reference voltage.

Figure 4:
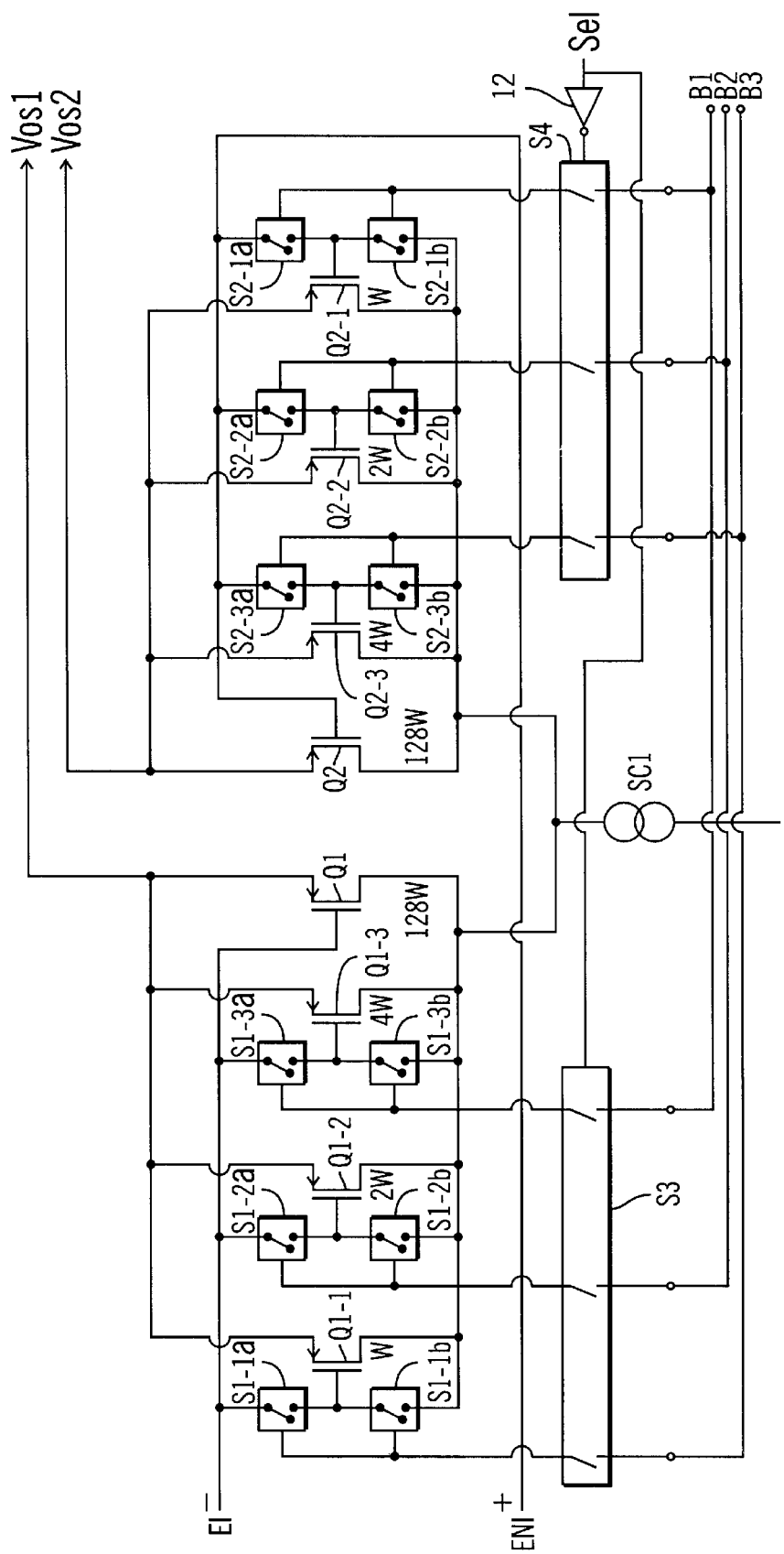
FIGS. 4 and 4B are diagrams of the input stage of an operational amplifier in accordance with an embodiment of the present invention.
Figure 4B:
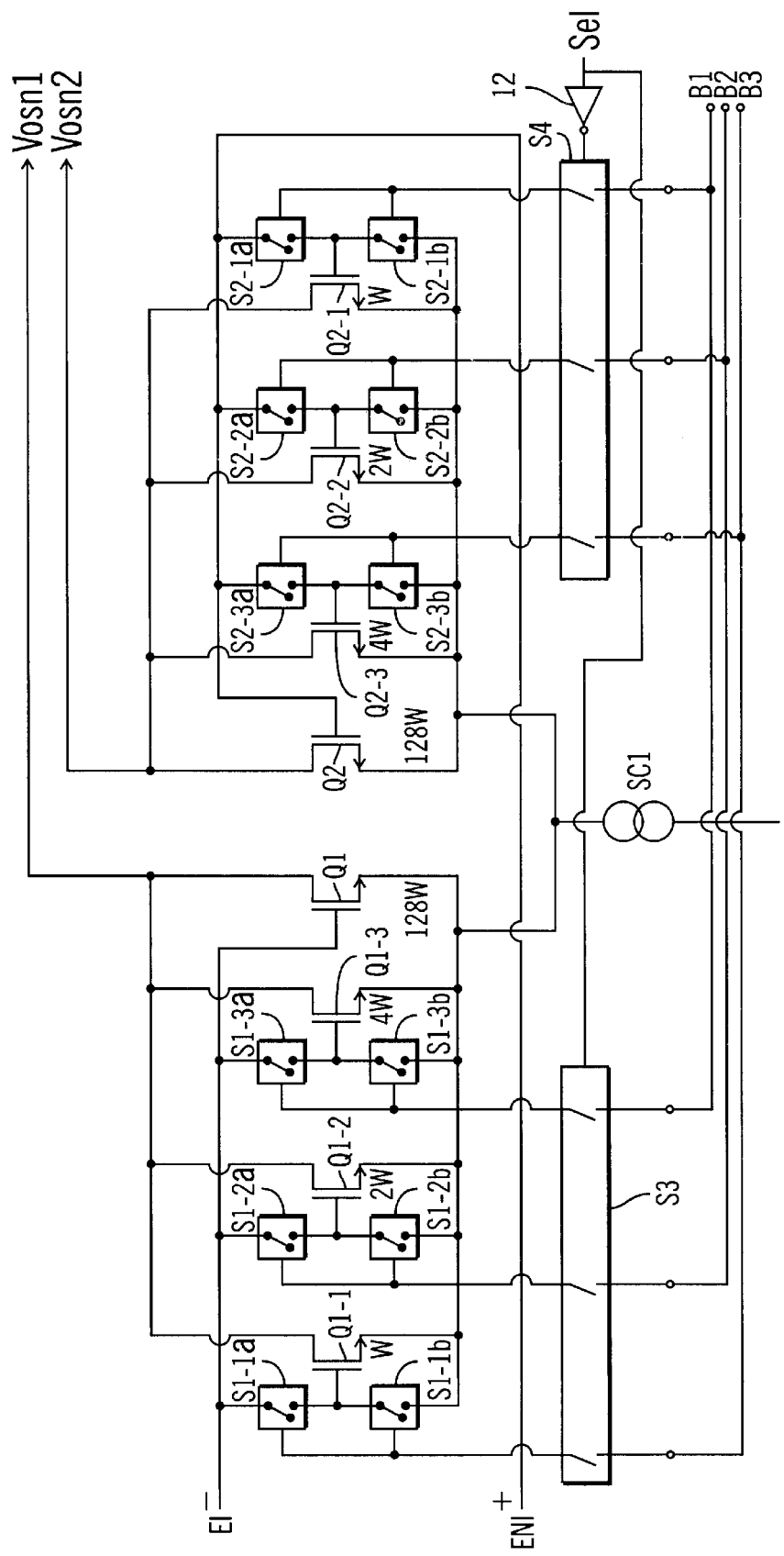

FIG. 4 shows the input stage of an operational amplifier according to an embodiment of the present invention. In this exemplary embodiment, the amplifier is made using CMOS technology. The input stage is formed by first and second NMOS transistors Q1 and Q2 whose gates are respectively connected to the inverting input EI (−) and the non-inverting input ENI (+). These two transistors constitute a differential pair and are analogous to transistors Q1 and Q2 of FIG. 1. The drains of transistors Q1 and Q2 are commonly connected to a constant current source SC1 (e.g., formed by two PMOS transistors connected as a current mirror, as in the case of transistors Q3 and Q4 in FIG. 1).

The sources of input transistors Q1 and Q2 each drive a respective complementary input Vos1 and Vos2 of an output circuit or an intermediate circuit, in accordance with conventional operational amplifier circuit construction. The input transistors Q1 and Q2 have gain characteristics that are identical in theory. Being MOS transistors, their gain is proportional to the source-drain channel width. In this exemplary embodiment, it shall be assumed that the source-drain channel width of each of transistors Q1 and Q2 is 128W, where W is a normalized width unit.

For each input transistor Q1 and Q2, there is provided a set of correction NMOS transistors, each of which can be selectively put into circuit in parallel with the associated input transistor Q1 or Q2. These correction transistors serve as trimmers for balancing the characteristics of the differential pair at the input. In this exemplary embodiment, each input transistor Q1 and Q2 is associated with three correction transistors, with transistors Q1-1, Q1-2, and Q1-3 being associated with the first input transistor Q1 and transistors Q2-1, Q2-2, and Q2-3 being associated with the second input transistor Q2.

To connect two or more transistors in parallel, their gates are connected together, their drains are connected together, and their sources are connected together. In this exemplary embodiment, the drain and source of each correction transistor Q1-1, Q1-2, and Q1-3 are respectively permanently connected to the drain and source of the associated first input transistor Q1. Likewise, the drain and source of each correction transistor Q2-1, Q2-2, and Q3-3 are respectively permanently connected to the drain and source of the associated second input transistor Q2. Correction transistors Q1-1, Q1-2, Q1-3, Q2-1, Q2-2, and Q2-3 each have a gain which is very much lower than that of input transistors Q1 and Q2. This gain is moreover different for each of the correction transistors.

The correction transistors are made using the same fabrication steps as the input transistors Q1 and Q2, with the differences in gain being obtained by adjusting the source-drain channel width. In this exemplary embodiment, the source-drain channel width of each of the correction transistors is established as follows. Correction transistor Q1-1 and Q2-1 have a channel width of 1W, correction transistors Q1-2 and Q2-2 have a channel width of 2W, and correction transistors Q1-3 and Q2-3 have a channel width of 4W. In this example, the gain of the correction transistors is between $1/128^{th}$ and $1/128^{th}$ of the gain of transistors Q1 or Q2. Moreover, the progression in channel width, and hence the gain characteristics, of the correction transistors correspond to a $2^n$ progression, where n is equal to 0, 1, 2, . . . .

The correction transistors are selectively put into service by a set of electronic switches S1, S2, S3, and S4. A first switching set S1 enables correction transistors Q1-1 to Q1-3 to be placed in parallel with the first input transistor Q1 by completing the parallel connection at the level of gate. Likewise, a second switching set S2 enables correction transistors Q2-1 to Q2-3 to be placed in parallel with the second input transistor Q2 by completing the parallel connection at the level of the gate. Switching sets S1 and S2 are identical with regard to their configuration and operation with respect to their corresponding input transistors Q1 and Q2. Consequently, for conciseness, only one switching set (S1) shall be described in detail.

Switching set S1 is composed of six electronic switches S1-1a, S1-1b, S1-2a, S1-2b, S1-3a, and S1-3b. These transistors are distributed in three pairs of switches, each being associated with one of the correction transistors Q1-1, Q1-2, and Q1-3. The pair of switches associated with the first correction transistor Q1-1 is formed by first and second switches S1-1a and S1-1b. The first switch S1-1a of this pair serves to selectively connect the gate of correction transistor Q1-1 with the gate of the first input transistor Q1, and thus also with the inverting input EI of the operational amplifier. The second switch S1-1b of the pair serves to selectively connect the gate of correction transistor Q1-1 with its drain, and hence to current source SC1. The same applies for the connection of the two other pairs of switches S1-2a and S1-2b, and S1-3a and S1-3b relative to their respective correction transistors Q1-1, Q1-2, and Q1-3, as shown in FIG. 4.

Each pair of switches is controlled by a logic signal B1, B2, or B3. As explained further below, these logic signals are connected to the associated pair of switches via a switching set S3. This switching set S3 serves to globally open or close the access of logic signals B1, B2, and B3 to the respective pairs of switches S1-1a and S1-1b, S1-2a and S1-2b, and S1-3a and S1-3b by an external selection signal Sel. For each pair of switches, one of the switches is open while the other is closed depending on the logic state of the corresponding command logic signal B1, B2, or B3.

When the logic signal B1, B2, or B3 is in the active state (for example, at logic 1 if positive logic is used), the first switch S1-1a, S1-2a, or S1-3a is closed and the second switch S1-1b, S1-2b, or S1-3b is open. In such a case, an active state of signal B1 (for example) causes the gate of correction transistor Q1-1 to be connected to the inverting input EI of the amplifier. Correction transistor Q1-1 is then put into circuit in parallel with the first input transistor Q1. Conversely, when the logic signal B1, B2, or B3 is in the inactive state, the first switch S1-1a, S1-2a, or S1-3a is open and the second switch S1-1b, S1-2b, or S1-3b is closed.

In this case, an inactive state of signal B1 (for example) puts correction transistor Q1-1 out of circuit with respect to the first transistor Q1 by disconnecting the link between the gate of the correction transistor and the inverting input EI, and by instead connecting the gate to the drain. For each pair of switches, the second switch S1-1b, S1-2b, and S1-3b essentially serves to prevent the gate of the correction transistor from floating when that transistor is put out of circuit. When the selection signal Sel commands the closure of switching set S3, it becomes possible to individually set each of the correction transistors Q1-1, Q1-2, and Q1-3 into circuit in parallel with the first input transistor Q1 of the amplifier, depending on the active state of the corresponding binary signals B1, B2, and B3.

As explained above, the second switching set S2 formed by switching transistor pairs S2-1a and S2-1b, S2-2a and S2-2b, and S2-3a and S2-3b is configured in exactly the same way as the first switching set S1 described above, with the connections just being with respect to the second input transistor Q2 and the non-inverting input ENI. This second switching set S2 is moreover associated with a fourth switching set S4 that is analogous to the above-mentioned third switching set S3. The fourth switching set S4 also receives the above-mentioned binary signals B1, B2, and B3 and the selection signal Sel, and these signals function analogously to those described with respect to the first and third switching sets S1 and S3.

However, the selection signal Sel commands switching S4 in a complementary manner to switching set S3. In other words, when signal Sel is at a first logic state, the third switching set S3 is closed to allow the binary signals B1, B2, and B3 to activate their respective switches of the first switching set S1, while the fourth switching set S4 is open to prevent the binary signals B1, B2, and B3 from activating their respective switches of the second switching set S2. Conversely, when signal Sel is at the second logic state, the fourth switching set S4 is closed to allow the binary signals B1, B2, and B3 to activate their respective switches of switching set S2, while the third switching set S3 is open to prevent the binary signals B1, B2, and B3 from activating their respective switches of the first switching set S1. This complementary operation is achieved by a logic inverter 12 that is connected between the command input of the fourth switching set S4 and the input of signal Sel.

Thus, the binary signals B1, B2, and B3, which can be assimilated to bits of a binary word, enable any combination of the correction transistors associated with one or the other of the input transistors Q1 or Q2 (according to the binary value of Sel) to be put in parallel with the circuit. In this exemplary embodiment, the correspondence between the active state of bits B1–B3 and the modification of the effective channel width of input transistor Q1 or Q2 due to the correction transistors is as follows. With bit B1 active, the effective channel width is +4W (=most significant bit). With bit B2 active, the effective channel width is +2W. With bit B3 active, the effective channel width is +1W (=least significant bit). Accordingly, it is possible to increase the effective source-drain channel width of one of the transistors Q1 or Q2 by a value of from 1W up to 15W in 1W increments by setting bits B1–B3 as binary words from 0 to 15.

Figure 5:
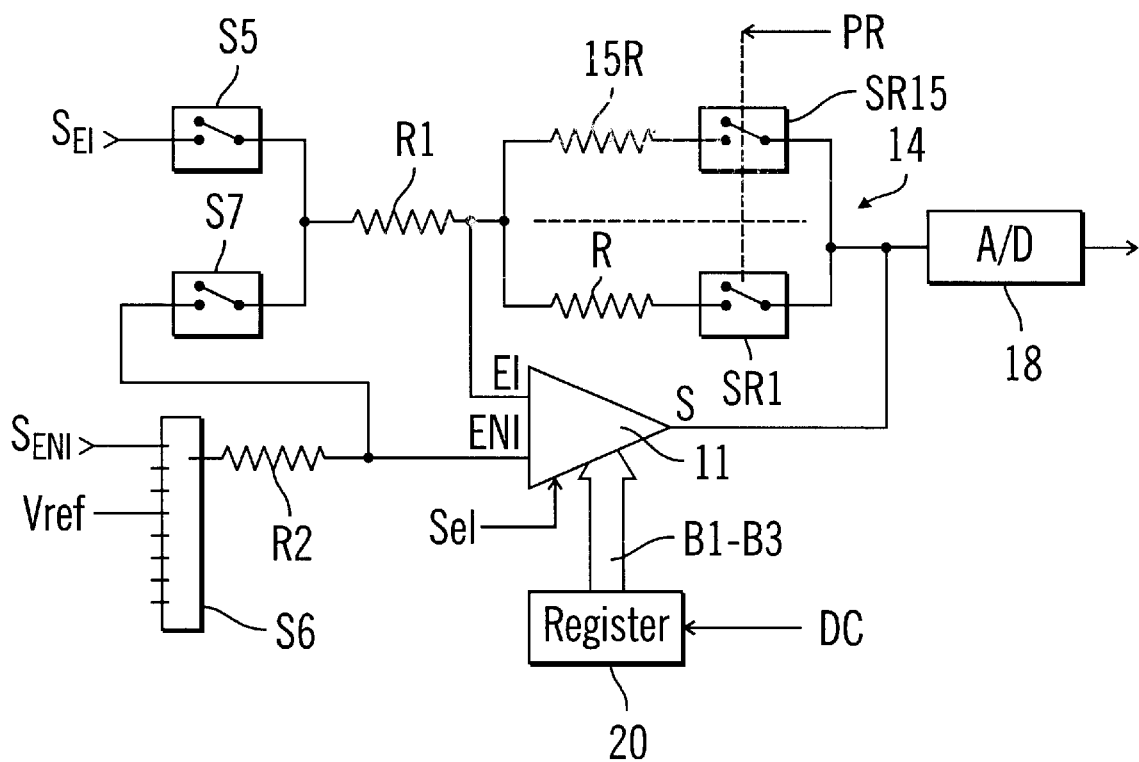
FIG. 5 is a circuit diagram of an exemplary construction for the operational amplifier of FIG. 4 so as to enable the offset voltage to be corrected.

FIG. 5 shows an exemplary construction for the operational amplifier of FIG. 4 so as to enable a correction of the output offset voltage by selectively putting into circuit correction transistors using bits B1–B3 and the selection signal Sel. In this exemplary embodiment, the operational amplifier 11 is functionally integrated in a CMOS circuit that includes analog-to-digital conversion stages on several channels. The elements shown in FIG. 5 are a part of one of the analog-to-digital conversion channels located around the operational amplifier 11.

The operational amplifier 11 is in a classical voltage follower configuration. Consequently, the output S of the amplifier is connected to its inverting input EI by a loop 14 having resistive means. In this embodiment, the resistive means is formed by a set of 15 resistors connected in parallel and having values ranging from R to 15R in increments of R. (For reasons of simplification, the resistors are identified by their values, and only the first resistor R and the last resistor 15R are shown.) Each of the 15 resistors can be selectively put into circuit in the loop 14 through a switch SR1 to SR15 that is connected in series with the associated resistor. For example, the value of R can be fixed to around 2 kΩ. These switches SR1–SR15 are controlled by resistance programming signals PR (e.g., delivered by a central processing unit).

In a conventional manner, the value of the resistance thus selected for the loop 14 allows the gain of the operational amplifier to adjusted, with the gain being proportional to the resistance of the loop. The resistive means is conventionally used to allow the gain of the operational amplifier to be programmed. Other circuit configurations at the level of the loop 14 can be used to determine the value of the offset voltage depending on the circuit's end use. The inverting input EI of the amplifier 11 is also connected to an input terminal for an external signal $S_{EI}$ via a resistor R1 having a value of R Ohms. This external input $S_{EI}$, can be selectively disconnected from the amplifier 11 by a switch S5 that is connected in series between that input and resistor R1.

The non-inverting input ENI of the operational amplifier 11 is connected via a resistor R2 of R Ohms to either an input for an external signal $S_{ENI}$ or a voltage reference Vref through another switch S6. Input ENI can also be selectively connected to the inverting input of EI of the amplifier 11 via resistor R1 through another switch S7 that is connected in series between the non-inverting input and the terminal of resistor R1 that is not connected directly to the inverting input. The output S of the amplifier 11 is supplied to an analog-to-digital converter 18 having a sufficient resolution (for example, 8 bits) in order to allow measurement of the offset voltage equal to a few millivolts.

The inputs B1, B2, and B3 of the operational amplifier 11 are connected to the output of register 20 to produce a binary word of three bits as a function of externally supplied data DC. The most significant and least significant bits of the word output from the shift register 20 are supplied to inputs BI and B3. Register 20 is configured so as to store and permanently provide at its output the value of the binary word, as long as the register is not updated by new data DC. The Sel input of amplifier 11 is connected to a binary selection output controlled by a central processing unit.

The correction of the offset value of amplifier 11 is achieved as follows. First, a step of measuring the offset voltage Vdecal of the operational amplifier 11 is performed using an algorithm that is executed in two stages. During this measurement step, the inverting input EI of the amplifier 11 is disconnected from its external input $S_{EI}$ by opening switch S5. The non-inverting input ENI of the amplifier 11 is connected to the reference voltage Vref by switch S6. At the level of the loop 14, switches SR1 and SR15 are closed so that the corresponding resistors are placed in the loop 14. These switching conditions are maintained throughout the measurement and correction process.

The data DC supplied to the register 20 initially establishes values for bits B1-B3 such that all the correction transistors Q1-1, Q1-2, Q1-3 or Q2-1, Q2-2, Q2-3 are out of circuit with respect to their associated input transistor Q1 or Q2 (for example, by setting all of the bits to the 0 state in a positive logic). In a first period, the aim is to establish a voltage representative of the difference between the reference voltage Vref and the offset voltage Vdecal at the output S of the amplifier 11. For this purpose, the inverting and non-inverting inputs EI and ENI of the amplifier are separated by opening switch S7. This configuration sets the operational amplifier 11 in a follower mode. The voltage of the output signal V1 under these conditions is then given by the following equation.

$$V1 = Vref - Vdecal \qquad (1)$$

The output voltage V1 is measured in digital form at the output of analog-to-digital converter 18. In a second period, the measurement conditions which yield the value V1 are maintained, except that the amplifier's inverting and non-inverting inputs EI and ENI are connected together via resistor R1, by closing switch S7. The output voltage V2 under these conditions obtained by the analog-to-digital converter 18 is then given by the following equation.

$$V2 = Vref - 16 \times Vdecal \qquad (2)$$

Subtracting equation (1) from equation (2) yields the following equation.

$$V2 - V1 = 15 \times Vdecal \qquad (3)$$

From equation (3) we arrive at the following equation for the offset voltage.

$$Vdecal = (V2 - V1)/15 \qquad (3)$$

Thus, the value of the obtained offset voltage Vdecal is independent of both the reference voltage Vref and any systematic error in the value of the voltage determined by the analog-to-digital converter 18.

After the measurement step, there follows a correction step whose purpose is to reduce the offset voltage Vdecal by as much as possible. For this purpose, an iterative approach is used in which successive approximations are used to obtain the values of the bits B1, B2, and B3 which give the optimal correction value to one of input transistors Q1 or Q2. The first measurement of the offset value enables a determination, based on the polarity of that voltage, of which of the input transistors Q1 or Q2 of the differential pair requires an increase in the effective width of its source-drain channel, as explained above.

If the offset voltage is positive, the action is on input transistor Q1 that is connected to the inverting input. In this case, the selection signal Sel is set to the first logic state to close the switches of the third group of switches S3 and to open the fourth group of switches S4. Conversely, if the offset voltage is negative, the action is on input transistor Q2 that is connected to the non-inverting input ENI. In this case, the selection signal Sel is set to the second logic state to close the switches of the fourth group of switches S4 and to open the switches of the third group of switches S3.

To illustrate an example, assume that the offset voltage Vdecal is positive so that one or several of the transistors Q1-1, Q1-2, and Q1-3 are placed in parallel in order to selectively increase the effective gain of input transistor Q1. In this case, the selection signal Sel is set to the first logic state. A first correction is attempted by putting correction transistor Q1-3 in parallel with transistor Q1 (transistor Q1-3 having a channel width of 4W). The other correction transistors Q1-1 and Q1-2 remain out of circuit. This configuration is obtained by writing the bit values B1=1 and B2=B3=0 into register 20 through the input data DC. In this case, the effective source-drain channel width of transistor Q1 is 128W+4W (i.e., 132W).

Next, the offset voltage measurement step is repeated to obtain a new value V'decal from equation (3) in the same manner as explained above. This new value V'decal is compared with the value Vdecal obtained previously. If it appears from this comparison that the correction performed overcompensated the offset voltage Vdecal (as determined by a change of sign in that value), the correction is modified by writing a new value in the register 20 to give a smaller increase in the gain of transistor Q1. This is achieved by increasing the effective source-drain channel width of transistor Q1 by a value of less than 4W (for example, by putting transistor Q1-3 out of circuit and putting transistor Q1-1 (source-drain channel width of 1W) into circuit. In this case, the new value written in the register 20 becomes B1=B2=0 and B3=1.

Conversely, if it appears that the correction performed undercompensated the offset voltage Vdecal, the correction is modified by writing a new value in the register 20 to give a greater increase in the gain of transistor Q1, by increasing the effective source-drain channel width by a value greater than 4W. For example, this can be achieved by keeping the correction transistor Q1-3 in circuit and also putting into circuit transistor Q1-2 (source-drain channel width of 2W). In this case, the new value written in the register 20 is B1=0 and B2=B3=1.

The above-described measurement and correction steps are repeated until a convergence of values for bits B1, B2, and B3 that confers optimal correction is obtained. This combination is stored and permanently supplied at the output of register 20 based on the last value that was written. Accordingly, the offset voltage compensation is permanently obtained. In other words, there is no need to refresh the offset, as in the case of conventional techniques. Naturally, the measurement and correction process applies mutatis mutandis to the case of compensation at the level of the second input transistor Q2.

The exemplary embodiment described above is integrated in a circuit configuration designed for an operational amplifier 11 operating in a normal mode. The only elements specific to the measurement and correction step are an analog-to-digital converter 18, a reference voltage source (which is often already present in amplifier circuits), a $2^n$ bit register (with n=3 in the example), correction transistors Q1-1, Q1-2, Q1-3, Q2-1, Q2-2, and Q2-3, and switching groups S1–S4. The chip area required by these additional elements is small in comparison with the space occupied by the operational amplifier 11. Moreover, these additional elements can provide a reduction in the area required for implementing the differential pair transistors Q1 and Q2. In particular, this transistor pair normally requires a configuration which consumes a significant chip area. This configuration can be diminished by virtue of the offset value compensation technique of the present invention.

It is easy for one of ordinary skill in the art to extrapolate from this example to a number n of correction transistors other than three for each input transistor.

The present invention can be implemented with common rail-type CMOS operational amplifiers designed to accept input voltage amplitudes ranging from the high supply voltage Vdd to the low supply voltage Vss. In this case, each input transistor Q1 and Q2 forming a differential pair is doubled. More specifically, the operational amplifier presents two differential transistor pairs operating in parallel, with each being formed by first and second transistors. The inverting input of the amplifier is connected to the gate of the first transistor of each pair, and the noninverting input is connected to the gate of the second transistor of each pair. A first differential pair of transistors is formed with NMOS transistors to allow common node voltages to be processed between 1V and Vdd. A second differential pair of transistors is formed with PMOS to allow common node voltages to be processed between ground and Vdd−1V.

The offset voltage is independent for the two differential pairs of transistors. In accordance with the present invention, it is possible to provide correction means (such as described with reference to FIGS. 4 and 5 having only one differential pair), separately for each differential pair. Consequently, to each differential pair is associated correction elements (for example, in the form of correction transistors that can be selectively put in parallel with associated input transistors). For the offset voltage measurement, it is simply required to use different reference voltages (e.g., one less than 1V to inhibit the NMOS differential transistor pair, and the other greater than Vdd−1V to inhibit the PMOS differential pair).

While preferred embodiments of the present invention have been described above, many variants are within the capability of one of ordinary skill in the art. In particular, the amplifier's internal correction elements can be implemented by components other than transistors (for example, with resistors that enable a programmable load to be obtained at the level of one input or another appropriate point of the amplifier). Moreover, it is possible to put into circuit correction elements in other than a parallel configuration.

Further, the correction elements described above are in the form of transistors which can be selectively put in parallel and associated with at least one of the input transistors. However, it is also possible to use correction elements in association with another part of the amplifier (for example, at the level of an intermediate stage or an output stage so as to allow the correction voltage to be corrected in an analogous manner). Additionally, the teachings of the present invention can easily be transposed to all types of operational amplifiers, whether based on bipolar or field effect transistors.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An operational amplifier comprising:
   an inverting input channel and a non-inverting input channel, each of the input channels controlling at least one input transistor;
   an output stage for supplying an output voltage as a function of a potential difference at the input channels; and
   at least one signal correction element in association with at least one of the input channels, the signal correction element being selectively put into circuit to selectively add an offset voltage correction signal to a signal that is supplied to the output stage in order to balance the characteristics of the two input channels,
   wherein the signal correction element is formed by at least one correction transistor that can be selectively put in parallel with a corresponding one of the input transistors.

2. The operational amplifier as defined in claim 1, wherein the response characteristic of the correction transistor is weak relative to the response characteristic of the corresponding one of the input transistors.

3. The operational amplifier as defined in claim 2, wherein the output signal value of the correction transistor is on the order of 0.5 to 10% of that of the input transistor for the same input signal.

4. The operational amplifier as defined in claim 1,
   wherein the signal correction element is formed by a number n of correction transistors, where n is an integer greater than 1, and
   each of the correction transistors is independently connectable in parallel with a corresponding one of the input transistors.

5. The operational amplifier as defined in claim 4, wherein the correction transistors associated with one of the input transistors do not all have the same response characteristic.

6. The operational amplifier as defined in claim 4, wherein the correction transistors associated with one of the input transistors exhibit a geometrical progression in their response value corresponding to a binary progression scale.

7. The operational amplifier as defined in claim 1, further comprising switching means for selectively placing the at least one correction transistor in circuit, the switching means being controlled based on an external input.

8. The operational amplifier as defined in claim 7, wherein the switching means is activated by binary signals.

9. The operational amplifier as defined in claim 8,
   wherein the binary signals form a binary word, and
   each bit of the binary word constitutes a binary signal serving to control the placing into circuit of one correction transistor.

10. The operational amplifier as defined in claim 1, wherein the operational amplifier is a CMOS operational amplifier for processing an input signal amplitude ranging from a low power supply voltage to a high power supply voltage of the amplifier, the CMOS operational amplifier including:
    for each input channel, two input transistors that each form an element of a differential transistor pair, one of the pairs being formed using NMOS technology, and the other being formed using PMOS technology,
    wherein each of the NMOS and PMOS transistors of at least one of the input channels is associated with at least one correction transistor.

11. An electronic system including at least one operational amplifier, said operational amplifier comprising:
    an inverting input channel and a non-inverting input channel, each of the input channels controlling at least one input transistor;
    an output stage for supplying an output voltage as a function of a potential difference at the input channels; and
    at least one signal correction element in association with at least one of the input channels, the signal correction element being selectively put into circuit to selectively add an offset voltage correction signal to a signal that is supplied to the output stage in order to balance the characteristics of the two input channels, wherein the signal correction element is formed by at least one correction transistor that can be selectively put in parallel with a corresponding one of the input transistors.

12. The electronic system as defined in claim 11, wherein the response characteristic of the correction transistor is weak relative to the response characteristic of the corresponding one of the input transistors.

13. The electronic system as defined in claim 11, wherein the signal correction element is formed by a number n of correction transistors, where n is an integer greater than 1, and each of the correction transistors is independently connectable in parallel with a corresponding one of the input transistors.

14. The electronic system as defined in claim 13, wherein the correction transistors associated with one of the input transistors do not all have the same response characteristic.

15. The electronic system as defined in claim 11, wherein the operational amplifier is a CMOS operational amplifier for processing an input signal amplitude ranging from a low power supply voltage to a high power supply voltage of the amplifier, the CMOS operational amplifier including:

for each input channel, two input transistors that each form an element of a differential transistor pair, one of the pairs being formed using NMOS technology, and the other being formed using PMOS technology, wherein each of the NMOS and PMOS transistors of at least one of the input channels is associated with at least one correction transistor.

16. A circuit for correcting the offset voltage of an operational amplifier, said circuit comprising:

means for determining the output voltage of the operational amplifier;

means for selectively applying a reference voltage to one of the inputs of the operational amplifier;

means for selectively coupling the inputs of the operational amplifier; and programming means for programming the placing of at least one signal correction element into circuit, wherein the programming means includes a register for storing data for programming the placing of the at least one signal correction element into circuit in the form of a binary word, and the binary word is continuously supplied at an output of the register and is externally loadable during an offset voltage correction process.

17. A method of correcting the offset voltage of an operational amplifier in which an offset correction signal is determined by an iteration of cycles, said method comprising the steps of:

selectively applying a reference voltage to one input of the operational amplifier;

measuring the offset voltage; and after measuring the offset voltage, putting one or more signal correction elements into circuit to add the offset voltage correction signal in order to balance the characteristics of input channels of the operational amplifier, wherein the step of measuring the offset voltage includes the sub-steps of:

measuring an output voltage of the operational amplifier in a voltage follower configuration with a feedback to the inverting input via a loop having a resistance of a first value and with the reference voltage applied to the non-inverting input, this output voltage expressing a difference between the reference voltage and the offset voltage; and measuring the output voltage with the inverting and non-inverting inputs coupled together, this output voltage expressing the voltage reference minus a multiple of the offset voltage determined by the feedback resistance.

18. A circuit for correcting the offset voltage of an operational amplifier, said circuit comprising:

means for determining the output voltage of the operational amplifier;

means for selectively applying a reference voltage to one of the inputs of the operational amplifier;

means for selectively coupling the inputs of the operational amplifier; and programming means for programming the placing of at least one signal correction element into circuit, wherein the signal correction element is formed by at least one correction transistor that can be selectively put in parallel with one of the input transistors of the operational amplifier.

19. A method of correcting the offset voltage of an operational amplifier in which an offset correction signal is determined by an iteration of cycles, said method comprising the steps of:

selectively applying a reference voltage to one input of the operational amplifier;

measuring the offset voltage; and after measuring the offset voltage, putting one or more signal correction elements into circuit to add the offset voltage correction signal in order to balance the characteristics of input channels of the operational amplifier, wherein the signal correction element is formed by a least one correction transistor that can be selectively put in parallel with one of the input transistors of the operational amplifier.

20. A CMOS operational amplifier for processing an input signal amplitude ranging from a low power supply voltage to a high power supply voltage of the amplifier, said CMOS operational amplifier comprising:

for each input channel, two input transistors that each form an element of a differential transistor pair, one of the pairs being formed using NMOS technology, and the other being formed using PMOS technology, wherein at least one of the NMOS and PMOS transistors of at least one of the input channels is associated with at least one correction element that can be selectively put into circuit with at least one of the input transistors in order to balance the characteristics of the two input channels, and the at least one correction element is formed by at least one correction transistor that can be selective put in parallel with one of the input transistors of the operational amplifier.

* * * * *